United States Patent
Matsuda et al.

(10) Patent No.: US 10,757,353 B2
(45) Date of Patent: Aug. 25, 2020

(54) PHOTOELECTRIC CONVERSION APPARATUS AND IMAGING SYSTEM

(71) Applicant: CANON KABUSHIKI KAISHA, Tokyo (JP)

(72) Inventors: Yojiro Matsuda, Kawasaki (JP); Hidekazu Takahashi, Zama (JP); Kazuaki Tashiro, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/462,589

(22) Filed: Mar. 17, 2017

(65) Prior Publication Data

US 2017/0280078 A1 Sep. 28, 2017

(30) Foreign Application Priority Data

Mar. 22, 2016 (JP) .................................. 2016-057546

(51) Int. Cl.
| | |
|---|---|
| *H04N 5/369* | (2011.01) |
| *H01L 51/42* | (2006.01) |
| *H01G 9/20* | (2006.01) |
| *H01L 27/30* | (2006.01) |
| *H01L 51/44* | (2006.01) |
| *H04N 5/376* | (2011.01) |
| *H04N 9/07* | (2006.01) |

(52) U.S. Cl.
CPC ......... *H04N 5/3698* (2013.01); *H01G 9/2009* (2013.01); *H01L 27/307* (2013.01); *H01L 51/4213* (2013.01); *H01L 51/441* (2013.01); *H04N 5/376* (2013.01); *H04N 9/07* (2013.01)

(58) Field of Classification Search
CPC ........ H04N 5/3698; H04N 5/376; H04N 9/07; H01G 9/2009; H01L 51/4213; H01L 27/307; H01L 51/441
See application file for complete search history.

(56) References Cited

U.S. PATENT DOCUMENTS

| | | | | |
|---|---|---|---|---|
| 2012/0193542 | A1* | 8/2012 | Yamada | ............ H01L 27/14663 250/366 |
| 2015/0115243 | A1* | 4/2015 | Miyanami | ............. H01L 27/307 257/40 |
| 2015/0311259 | A1* | 10/2015 | Joei | .................... H01L 27/14636 250/208.1 |
| 2016/0372520 | A1* | 12/2016 | Joei | ........................ H01L 51/448 |
| 2017/0117329 | A1* | 4/2017 | Maruyama | ............ H01L 27/307 |

FOREIGN PATENT DOCUMENTS

JP 2012-209421 A 10/2012

* cited by examiner

*Primary Examiner* — Timothy J Henn
(74) *Attorney, Agent, or Firm* — Canon U.S.A., Inc. I.P. Division

(57) ABSTRACT

The present disclosure provides a photoelectric conversion apparatus which includes a semiconductor substrate, signal output units disposed on the semiconductor substrate, a plurality of photoelectric conversion layers disposed on a surface of the substrate, and an upper electrode in this order. The photoelectric conversion apparatus further includes insulation layers which are disposed between the plurality of photoelectric conversion layers and which have lines connected to power supply units. The upper electrode and the lines are electrically connected to each other on side surfaces of the insulation layers.

20 Claims, 3 Drawing Sheets

PHOTOELECTRIC CONVERSION APPARATUS AND IMAGING SYSTEM

BACKGROUND OF THE INVENTION

Field of the Invention

The present disclosure generally relates to a photoelectric conversion apparatus and an imaging apparatus using the photoelectric conversion apparatus.

Description of the Related Art

As an imaging element, a light-receiving element which includes elements which have photoelectric conversion portions in semiconductors and which are arranged in a matrix as pixels, which performs charge transfer on signals generated by photoelectric conversion of the pixels using a charge-coupled device (CCD) circuit or a complementary metal-oxide semiconductor (CMOS) circuit, and which reads the signals has been widely used.

Japanese Patent Laid-Open No. 2012-209421 discloses a configuration in which a photoelectric conversion portion having a photoelectric conversion film sandwiched between two transparent electrodes is disposed on a semiconductor substrate. With this configuration, the photoelectric conversion film is inclined relative to the semiconductor substrate so that sensitivity is improved.

FIG. 5 is a cross-sectional view of the configuration of the photoelectric conversion apparatus disclosed in Japanese Patent Laid-Open No. 2012-209421. A lower electrode 121, a photoelectric conversion layer 11, and an upper electrode 12 are formed on an inner wall of each of recessed portions 7 on a semiconductor substrate 5, and a protection layer 17 is formed all over the upper electrode 12. Furthermore, the lower electrode 121 and the upper electrode 12 are connected to each other on the semiconductor substrate 5 through a plug 14. In the configuration disclosed in Japanese Patent Laid-Open No. 2012-209421, disconnection of the upper electrode 12 is likely to occur in top regions (regions B) where side surfaces and upper surfaces of the recessed portions 7 intersect with each other. The disconnection occurs since a thickness of the upper electrode 12 is likely to be thin due to step differences of the top regions (the regions B) of the recessed portions 7.

SUMMARY OF THE INVENTION

The present disclosure generally provides a photoelectric conversion apparatus which includes a semiconductor substrate, signal output units disposed on the semiconductor substrate, a plurality of photoelectric conversion layers disposed on a surface of the substrate, and an upper electrode in this order. The photoelectric conversion apparatus further includes insulation layers which are disposed between the plurality of photoelectric conversion layers and which have lines connected to power supply units. The upper electrode and the lines are electrically connected to each other on side surfaces of the insulation layers.

Further features of the present disclosure will become apparent from the following description of exemplary embodiments with reference to the attached drawings.

DESCRIPTION OF THE EMBODIMENTS

An embodiment of the present disclosure will be described in detail hereinafter with reference to the accompanying drawings. General techniques in this technical field may be applied to portions not particularly disclosed in this specification or the drawings.

The present disclosure provides a photoelectric conversion apparatus including insulation layers, that is, banks, disposed between different photoelectric conversion elements disposed on a substrate. The photoelectric conversion apparatus further includes an upper electrode continuously disposed among the photoelectric conversion elements. Points in which the upper electrode is connected to connection lines are included in side surfaces of the insulation layers. Since the points in which the upper electrode is electrically connected to the connection lines are disposed on the side surfaces of the insulation layers, the photoelectric conversion apparatus is capable of suppressing disconnection of the electrical connection of the upper electrode.

Figure 1:
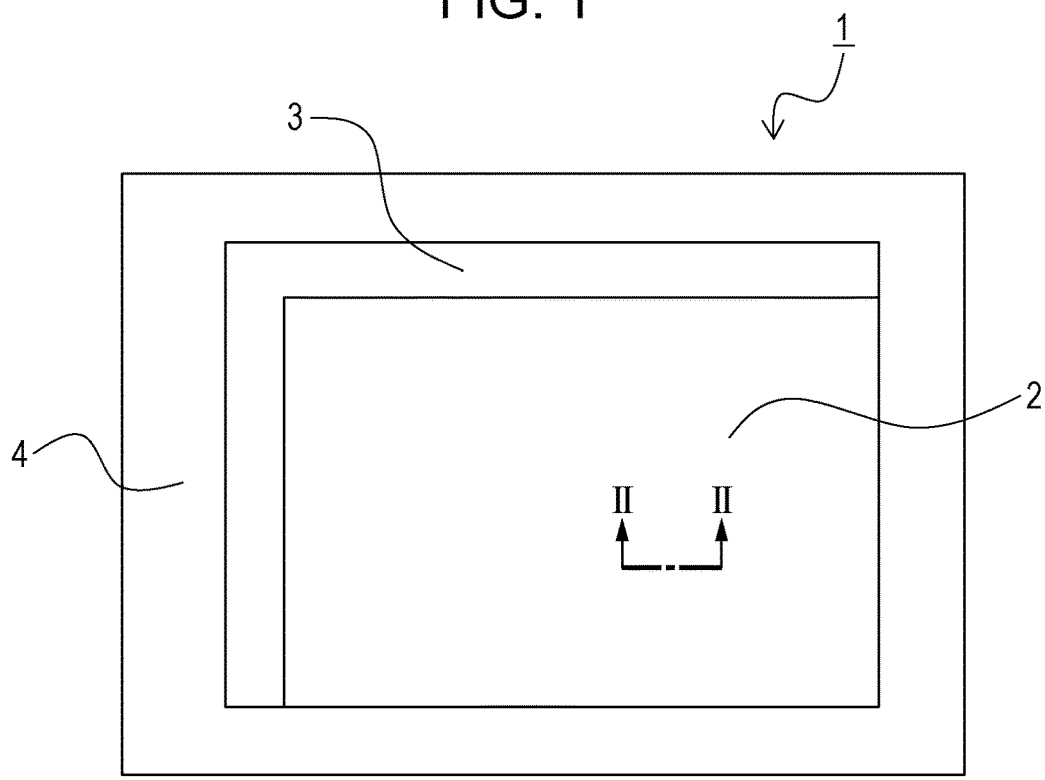
FIG. 1 is a plan view of a photoelectric conversion apparatus.

FIG. 1 is a plan view of a photoelectric conversion apparatus 1. The photoelectric conversion apparatus 1 includes a light-receiving region 2, a light-shielding region 3, and a peripheral circuit region 4. The light-receiving region 2 and the light-shielding region 3 include a plurality of pixels arranged in a matrix. Each of the pixels at least includes a photoelectric conversion film and a reading circuit which reads a signal generated in the photoelectric conversion film.

The reading circuit includes a transfer transistor electrically connected to the photoelectric conversion film and a reset transistor which resets the photoelectric conversion film, for example. The peripheral circuit region 4 is a region including a peripheral circuit which controls operation of the light-receiving region 2 and which processes a signal read from the light-receiving region 2, and includes an amplification circuit, a horizontal scanning circuit, and a vertical scanning circuit, not illustrated, for example. The light-shielding region 3 and the peripheral circuit region 4 are covered with a light-shielding film when viewed from a direction orthogonal to a surface of the semiconductor substrate.

On the other hand, the light-receiving region 2 does not have such a light-shielding film or has a light-shielding film having openings for individual pixels. At least some of the pixels arranged in the light-shielding region 3 are optical black pixels, and signals obtained in the optical black pixels are used to remove fixed pattern noise.

Figure 2:
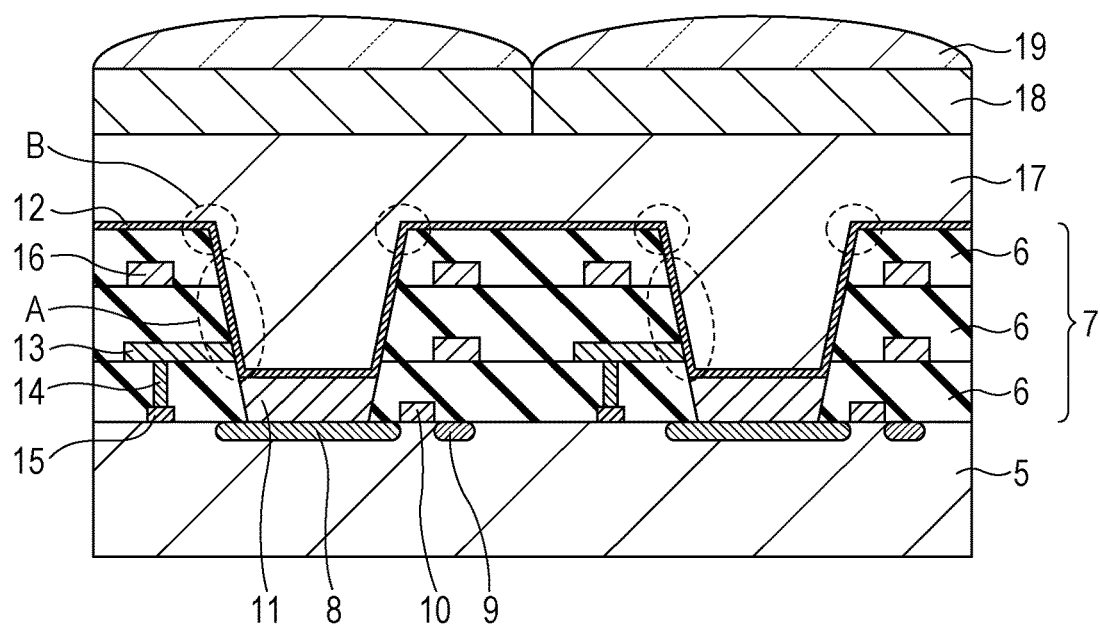
FIG. 2 is a cross-sectional view schematically illustrating the photoelectric conversion apparatus.

FIG. 2 is a cross-sectional view schematically illustrating the light-receiving region 2 taken along a line II to II of FIG. 1 and two pixels are illustrated. The pixels have the same configuration, and therefore, a configuration of one of the pixels will be described hereinafter. Insulation layers 6 are disposed on a semiconductor substrate 5. The insulation layers 6 may include a connection line 13. The connection line 13 connects an upper electrode 12 of the photoelectric conversion element and a power supply line 15 to each other. A recessed portion 7 is shaped by the plurality of insulation layers 6, and a charge accumulation portion 8 is formed in a position corresponding to a bottom portion of the recessed portion 7 on the semiconductor substrate 5. The charge accumulation portion 8 may be an output portion which outputs a signal to a signal processing circuit using the reading circuit. The output portion may or may not have a function of accumulating charge. A case where the output portion has the charge accumulation function will be illustrated hereinafter.

The charge accumulation portion 8 is formed as an impurity semiconductor region on the semiconductor substrate 5 as described below. Furthermore, a photoelectric conversion layer 11 and an upper electrode 12 are formed on the charge accumulation portion 8 in this order. A floating diffusion (FD) 9 is disposed adjacent to the charge accumulation portion 8, and a gate electrode 10 is disposed between the charge accumulation portion 8 and the FD 9. The FD 9 and the gate electrode 10 form a transfer transistor.

In the photoelectric conversion apparatus of the present embodiment, the upper electrode 12 and the connection line 13 are electrically connected to each other on a side surface of the recessed portion 7 as illustrated in a region A of FIG. 2. The connection line 13 is electrically connected to the power supply line 15 disposed on the semiconductor substrate 5 through a plug 14. The side surface of the recessed portion 7 is inclined relative to a main surface of the semiconductor substrate 5. That is, distances between portions of the side surface of the recessed portion 7 and the semiconductor substrate 5 are different.

In regions B of FIG. 2, thickness of the upper electrode 12 is likely to be thin. Therefore, the upper electrode 12 may be disconnected. On the other hand, the upper electrode 12 is not likely to be disconnected in the region A, and therefore, a voltage may be stably supplied to the photoelectric conversion apparatus 1.

The insulation layers 6 include wiring layers 16. The wiring layers 16 electrically connect the transfer transistor and the reset transistor, not illustrated, included in the light-receiving region 2 to the amplification circuit, the horizontal scanning circuit, and the vertical scanning circuit, not illustrated, disposed in the peripheral circuit region 4.

A protection layer 17 formed on the upper electrode 12 protects the components of the photoelectric conversion apparatus 1. A color filter 18 disposed on the protection layer 17 selects a wavelength of light incident on the photoelectric conversion layer 11. A microlens 19 which collects light into the photoelectric conversion layer 11 is disposed on the color filter 18.

Any constituent element may be used for the semiconductor substrate 5 as long as the charge accumulation unit 8 and the FD 9 are formed by impurity implantation. Examples of the constituent element include Si, GaAs, and GaP.

The insulation layers 6 are formed by an insulation body, such as a silicon oxide or a silicon nitride. The insulation layers 6 are disposed between the plurality of photoelectric conversion layers 11 included in the photoelectric conversion apparatus 1 and are also referred to as banks. The insulation layers 6 form the recessed portion 7, and the upper electrode 12 and the connection line 13 are electrically connected to each other on the side surface of the recessed portion 7. The side surface of the recessed portion 7 may be inclined relative to the semiconductor substrate 5.

The charge accumulation portion 8 is an N-type semiconductor region or a P-type semiconductor region formed on the semiconductor substrate 5 by ion implantation and accumulates charge generated in the photoelectric conversion layer 11.

When electrons are to be accumulated, an N-type semiconductor region may be formed on the surface of the semiconductor substrate 5 or a diode having a PN structure may be formed using the surface of the semiconductor substrate 5 for accumulation. In any of the cases, electrons may be accumulated in the N-type semiconductor region.

On the other hand, when holes are to be accumulated, a P-type semiconductor region may be formed on the surface of the semiconductor substrate 5 or a diode having an NP structure may be formed using the surface of the semiconductor substrate 5 for accumulation. In any of the cases, holes may be accumulated in the P-type semiconductor region.

The accumulated charge is transferred from the charge accumulation portion 8 to the FD 9. The transfer of the charge may be controlled by the gate electrode 10. The charge generated in the photoelectric conversion layer 11 is accumulated in the charge accumulation portion 8, the charge accumulated in the charge accumulation portion 8 is transferred to the FD 9, and the charge is converted into a voltage by the amplification transistor, not illustrated, connected to the FD 9.

The gate electrode 10 may be formed of material of low resistance, such as metal including polysilicon, copper, nickel, titanium, or aluminum or alloy of them.

In the photoelectric conversion apparatus 1 of the present embodiment, the charge accumulation portion 8 and the FD 9 may be directly connected to each other without an electrode or may be connected to each other through a lower electrode, not illustrated. When the lower electrode is used, the lower electrode may be disposed between the photoelectric conversion layer 11 and the charge accumulation portion 8. The photoelectric conversion layer 11 and the charge accumulation portion 8 are preferably in contact with each other.

Since an electrode is not disposed between the photoelectric conversion layer 11 and the charge accumulation portion 8 in the photoelectric conversion apparatus 1 of the present embodiment, that is, the photoelectric conversion layer 11 and the charge accumulation portion 8 are in contact with each other, thermal noise (kTC noise) to be generated at a time of resetting may be reduced.

The photoelectric conversion layer 11 is constituted by a semiconductor layer including one of inorganic material, organic material, and hybrid material of inorganic material and organic material. Examples of the photoelectric conversion layer 11 including inorganic material include amorphous silicon, a group III-V compound semiconductor, such as GaAs, GaP, or AlSb, a group II-VI compound semiconductor, such as CsSe, ZnS, or HdTe, and a group IV-VI compound semiconductor, such as PbS, PbTe, or CuO. Furthermore, a quantum dot layer constituted by such a compound semiconductor may be used for the photoelectric conversion layer 11. The quantum dot layer may be used as a film dispersed in organic material.

Examples of the photoelectric conversion layer 11 including organic material include fullerene material, phthalocyanine material, metallic complex material, squarylium material, amine material, indane material, and fluorine material. The photoelectric conversion layer 11 may be formed of one of the organic materials or a plurality of materials. Alternatively, the photoelectric conversion layer 11 may be formed by laminating such layers.

Examples of the photoelectric conversion layer 11 including hybrid material of organic material and inorganic material include an organic-inorganic hybrid perovskite film. Material constituting the organic-inorganic hybrid perovskite film is represented by a general formula $ABX_2$. In the general formula, "A" and "B" denote cation material and "X" denotes anion material. The organic-inorganic hybrid material uses one of A, B, and X as organic material, and examples of the organic-inorganic hybrid material include $CH_3NH_3PbI_3$ (A=$CH_3NH_3$, B=Pb, and X=I).

The photoelectric conversion apparatus 1 of the present embodiment may have a function layer between the photoelectric conversion layer 11 and the charge accumulation portion 8. The function layer is seen to be a portion of the photoelectric conversion layer 11, and the arrangement relationship between the function layer and the other components is based on the arrangement relationship between the photoelectric conversion layer 11 and the other components irrespective of presence or absence of the function layer. Specifically, when the photoelectric conversion apparatus 1 has a lower electrode, a function layer is disposed between the photoelectric conversion layer 11 and the lower electrode.

Examples of the function layer include a charge transport layer and a charge block layer. As material of the charge transport layer, material having high mobility of holes and electrons may be used. As material of a hole block layer, material having a deep highest occupied molecular orbital (HOMO) level (far from a vacuum level in terms of energy) may be used. As material of an electron block layer, material having a shallow lowest unoccupied molecular orbital (LUMO) level (near the vacuum level) may be used.

The HOMO and the LUMO may be expressed as "high" HOMO or "high" LUMO and "low" HOMO or "low" LUMO in accordance with a magnitude of absolute values thereof. Specifically, the term "deep HOMO" may also be referred to as "high HOMO". The same is true to the other cases.

Furthermore, another type of photoelectric conversion layer which performs photoelectric conversion on light having a wavelength different from that of the photoelectric conversion layer 11 may be further provided. The other type of photoelectric conversion layer may be disposed between the photoelectric conversion layer 11 and the upper electrode 12 or may be disposed on the upper electrode 12.

When the other type of photoelectric conversion layer is provided, different light beams having different wavelengths may be received in the same position.

The upper electrode 12 is disposed on a side in which light is incident and preferably has high optical transparency so as to allow a large amount of light to be incident on the photoelectric conversion layer 11. As electrode material, transparent oxide conductive material, such as stannic oxide, indium oxide, indium tin oxide, or indium zinc oxide, is preferably used.

Note that the transparent oxide conductive material has lower conductivity when compared with metallic material, such as aluminum or copper. Furthermore, the upper electrode 12 is preferably thin, that is, the upper electrode 12 preferably has a thickness in a range from 10 nm inclusive to 100 nm inclusive for attaining high optical transparency and a short fabrication cycle time.

When the transparent oxide conductive material having low conductivity is used for the upper electrode 12, high sheet resistance is obtained since the upper electrode 12 is thin. However, on the side surface of the recessed portion 7 indicated as the region A, since the upper electrode 12 and the connection line 13 are electrically connected to each other, a distance in which electrons move on the upper electrode 12 having the high sheet resistance may be reduced.

Therefore, even in a case where material having low conductivity is used, a high voltage may be applied to the upper electrode 12 with a short pulse. In a case where the photoelectric conversion layer 11 is formed of organic material having charge mobility smaller than that of inorganic material, in particular, it is advantageous in that a high voltage may be applied to the upper electrode 12 with a short pulse signal.

In a case where a lower electrode is provided, the lower electrode is preferably formed of metallic material having high conductivity. For example, metallic material, such as aluminum, copper, silver, molybdenum, or titanium nitride, may be used.

The connection line 13 may surround the photoelectric conversion layer 11. With this arrangement, the connection line 13 may prevent light transmitted through a color filter of an adjacent photoelectric conversion layer 11 from reaching the photoelectric conversion layer 11. Consequently, color mixture of the imaging element may be suppressed.

The connection line 13 may be formed of metallic material having high conductivity. For example, metallic material, such as aluminum, copper, silver, molybdenum, or titanium nitride, may be used.

The plug 14 is used to connect the connection line 13 and the power supply line 15 to each other and may be formed of metal, such as tungsten, titanium, or copper or an alloy of them.

The power supply line 15 is connected to an external power source which supplies a voltage to the photoelectric conversion apparatus 1 and formed of metal, such as copper, nickel, titanium, or aluminum or an alloy of them.

The wiring layers 16 are formed over the semiconductor substrate 5 so as to electrically connect the light-receiving region 2 and the peripheral circuit region 4 to each other. The wiring layers 16 are preferably disposed on the insulation layers 6 which form the recessed portion 7. The wiring layers 16 are formed of conductive material, such as copper. The wiring layers 16 are formed by a general method, such as electroless plating.

The protection layer 17 is formed on the upper electrode 12. The protection layer 17 may be formed of silicon nitride, silicon nitride oxide, silicon oxide, or aluminum oxide.

The protection layer 17 may be formed by a general method, such as a spattering method, a chemical vapor deposition (CVD) method, or an atomic layer deposition (ALD) method.

The protection layer 17 may be formed as a single layer using one of the materials described above or may be formed by laminating layers.

The color filter 18 allows a larger amount of light having a predetermined wavelength to pass when compared with light having other wavelengths. Three types of color, that is, R, G, and B, may be used to cope with an entire range of visible light. When the three types of color, that is, R, G, and B, are to be used, Bayer arrangement or the like may be used for arrangement of the color filters 18.

The microlens 19 is an optical member which collects light into the photoelectric conversion layer 11. Although a half sphere lens is illustrated in FIG. 2, the shape is not limited to this. Not only the shape but also material is not limited as long as the material does not disturb the light collection.

The photoelectric conversion layers 11 of the photoelectric conversion apparatus 1 according to the present disclosure may be arranged in a matrix.

The photoelectric conversion apparatus 1 according to the present disclosure may be an imaging element further having a reading circuit connected to the photoelectric conversion apparatus 1 and a signal processor which processes a read signal. The signal processor performs signal processing based on information read by the reading circuit and is constituted by a CCD circuit, a CMOS circuit, or the like.

The photoelectric conversion apparatus 1 according to the present disclosure includes the plurality of photoelectric conversion layers 11 which perform photoelectric conversion on light beams having different wavelengths and which may be laminated on one another.

If the plurality of photoelectric conversion layers 11 correspond to wavelengths of R, G, and B, imaging may be performed on a visible light region.

An imaging apparatus including a plurality of lenses and the imaging element according to the present disclosure may be configured. The imaging element included in the imaging apparatus receives light transmitted through the plurality of lenses so that information to be transferred to the signal processor is generated from the received light.

The photoelectric conversion apparatus 1 according to the present disclosure may further include a transmission unit which externally transmits data and a reception unit which receives externally supplied data. The imaging apparatus including the reception unit or the transmission unit may be a network camera which is fixed in a certain position.

Fabrication Method of Photoelectric Conversion Apparatus

An embodiment of the photoelectric conversion apparatus 1 will be described with reference to the accompanying drawings. FIG. 2 is the cross-sectional view schematically illustrating the configuration of the photoelectric conversion apparatus 1. The plurality of pixels are arranged in a matrix in this embodiment.

In the cross-sectional view of the configuration, two of the plurality of pixels are illustrated. FIGS. 3A to 3F and FIG. 4 are diagrams schematically illustrating a fabrication flow of this embodiment.

Figure 3A:
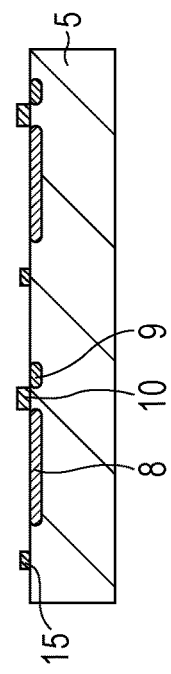
FIGS. 3A to 3F are diagrams schematically illustrating a fabrication flow of the photoelectric conversion apparatus.

Circuits including the transfer transistors and the reset transistors, not illustrated, are formed on the semiconductor substrate 5. In FIG. 3A, the charge accumulation portions 8, the FDs 9, the gate electrodes 10 of the transfer transistors, and the power supply lines 15 are illustrated.

Figure 3B:
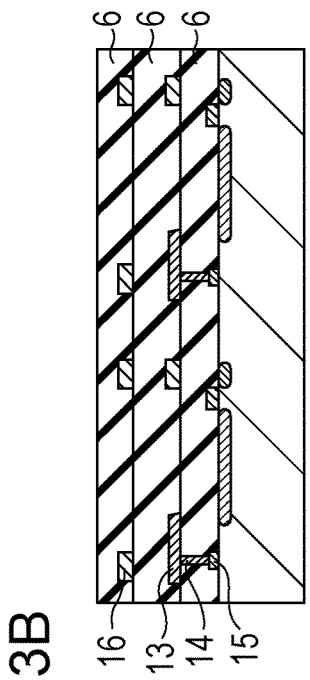

As illustrated in FIG. 3B, the insulation layers 6 are formed all over the semiconductor substrate 5, and thereafter, the connection lines 13 and the wiring layer 16 are successively formed. Furthermore, the connection lines 13 and the power supply lines 15 are electrically connected to each other through the respective plugs 14.

Figure 3C:
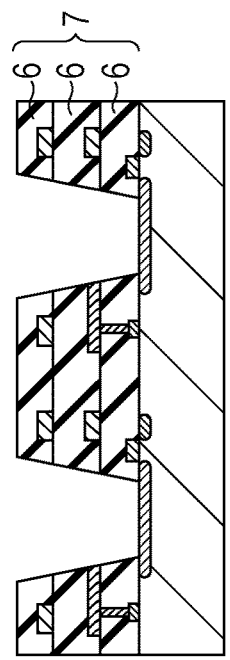

As illustrated in FIG. 3C, the recessed portions 7 are formed on the semiconductor substrate 5 where the charge accumulation portions 8 have been formed. The recessed portions 7 may be formed by dry etching, and connection lines 13 are exposed on the side surfaces (the regions A) of the recessed portions 7. In this case, top regions (the regions B) in which the side surfaces and upper surfaces of the recessed portions 7 intersect with each other likely have a precipitous shape.

Figure 3D:
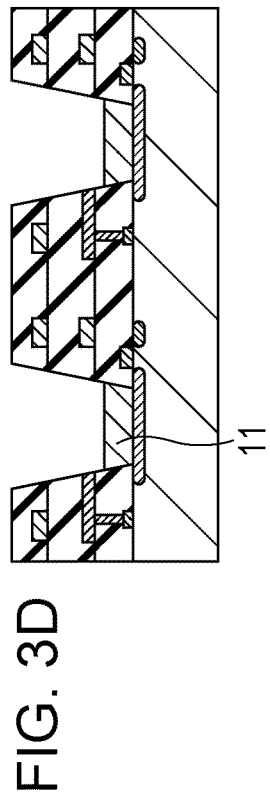

As illustrated in FIG. 3D, the photoelectric conversion layers 11 are formed on the charge accumulation portions 8. The photoelectric conversion layers 11 may be formed by a vacuum deposition method, an ink-jet method, a screen printing method, a photolithography method, or the like.

Figure 3E:
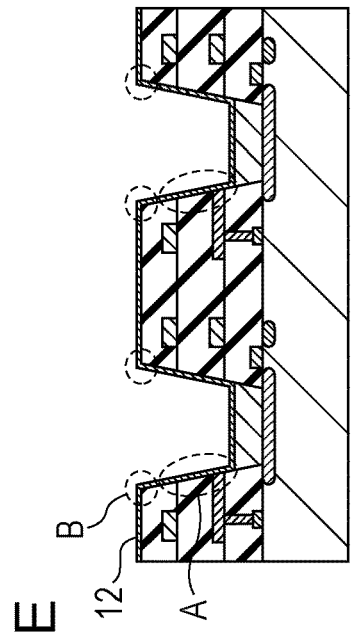

As illustrated in FIG. 3E, the upper electrode 12 is entirely formed. The upper electrode 12 may be formed by a vacuum deposition method, a spattering method, or the like. In this case, the upper electrode 12 and the connection lines 13 are electrically connected to each other on the side surfaces of the recessed portions 7 denoted as the regions A.

Figure 3F:
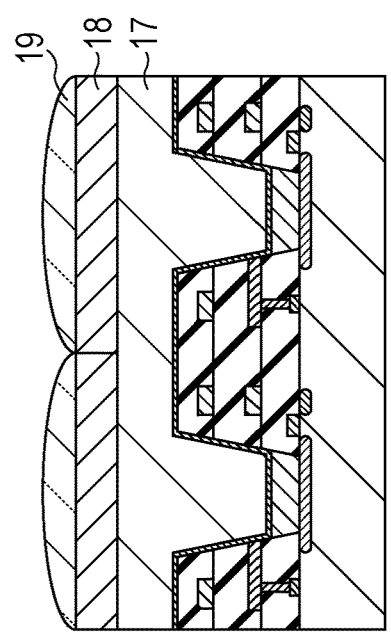

As illustrated in FIG. 3F, the protection layer 17, the color filters 18, and the microlenses 19 are successively formed on the upper electrode 12.

In the photoelectric conversion apparatus 1 of this embodiment, the connection lines 13 and the upper electrode 12 are stably connected to each other in an electrical manner on the side surfaces of the recessed portions 7 denoted as the regions A, and therefore, a pulse signal of a high voltage may be stably applied to the upper electrode 12.

Other Embodiments

Figure 4:
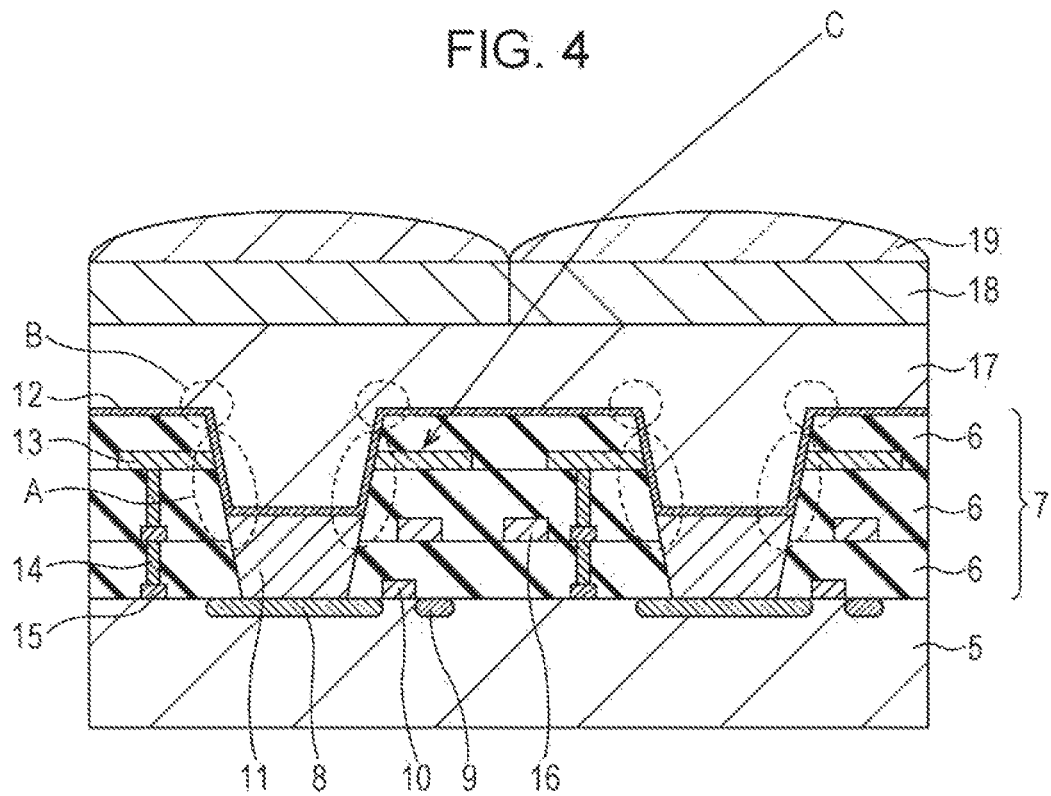
FIG. 4 is a cross-sectional view schematically illustrating the photoelectric conversion apparatus.
Figure 5:
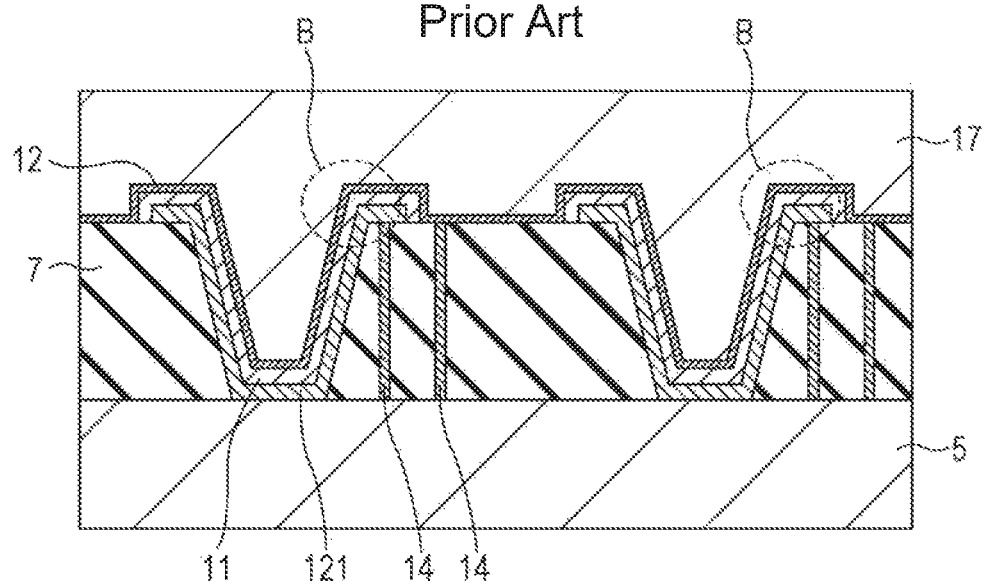
FIG. 5 is a cross-sectional view schematically illustrating the photoelectric conversion apparatus according to the related art.

Another embodiment of the present disclosure will be described with reference to the accompanying drawing. FIG. 4 is a cross-sectional view schematically illustrating a photoelectric conversion apparatus 1 according to this embodiment. A plurality of pixels are arranged in a matrix in this embodiment. In FIG. 4, two of the plurality of pixels are illustrated.

The photoelectric conversion apparatus 1 has the same configuration as that of the first embodiment except for positions of connection lines 13. In this embodiment, the connection lines 13 are disposed in positions nearer to an upper surface of an upper electrode 12 when compared with the connection lines 13 of the first embodiment. The positions nearer to the upper surface of the upper electrode 12 are located between a semiconductor substrate 5 of the photoelectric conversion apparatus 1 and the upper electrode 12 and may be represented as positions on a "light incident side".

Since the connection lines 13 are disposed in the positions illustrated in FIG. 4, a photoelectric conversion layer 11 in a certain pixel does not receive a light beam C incident on an adjacent pixel. Consequently, color mixture of the imaging element may be suppressed.

Furthermore, the connection lines 13 may surround photoelectric conversion layer 11 when viewed from a direction vertical to a main surface of the semiconductor substrate 5. In this case, color mixture may be suppressed at any angle.

According to the present disclosure, a photoelectric conversion apparatus with high reliability which stably applies a desired voltage to photoelectric conversion layers by electrically connecting an upper electrode and connection lines with each other on side surfaces of insulation portions on a semiconductor substrate may be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-057546 filed Mar. 22, 2016, which is hereby incorporated by reference herein in its entirety.

What is claimed is:

1. A photoelectric conversion apparatus which includes a substrate and a plurality of photoelectric conversion elements;
    at least one of the photoelectric conversion elements comprising a photoelectric conversion layer disposed on a surface of the substrate, and an upper electrode including a first portion and a second portion inclined relative to the first portion in this order, the photoelectric conversion apparatus comprising:
    an insulation layer which is disposed between the plurality of photoelectric conversion elements and has a line connected to a power supply unit, wherein the upper electrode and the line are electrically connected at the second portion of the upper electrode.

2. The photoelectric conversion apparatus according to claim 1, further comprising a signal out unit on the substrate, wherein the signal output unit and the photoelectric conversion layer are in contact with each other.

3. The photoelectric conversion apparatus according to claim 1, wherein a lower electrode is disposed between the signal output unit and the photoelectric conversion layer.

4. The photoelectric conversion apparatus according to claim 1, wherein the side surfaces of the insulation layer are inclined relative to the substrate.

5. The photoelectric conversion apparatus according to claim 1, wherein the photoelectric conversion layer comprises organic material or hybrid material of organic material and inorganic material.

6. The photoelectric conversion apparatus according to claim 5, wherein the photoelectric conversion layer includes a perovskite layer.

7. The photoelectric conversion apparatus according to claim 6, further comprising:
another type of photoelectric conversion layer which performs photoelectric conversion on light having a wavelength different from a wavelength of the photoelectric conversion layer,
wherein the other type of photoelectric conversion layer is disposed between the photoelectric conversion layer and the upper electrode.

8. The photoelectric conversion apparatus according to claim 1, wherein the line surrounds the photoelectric conversion layer when viewed from a direction orthogonal to a main surface of the substrate.

9. The photoelectric conversion apparatus according to claim 1, further comprising:
another type of photoelectric conversion layer which performs photoelectric conversion on light having a wavelength different from a wavelength of the photoelectric conversion layer,
wherein the other type of photoelectric conversion layer is disposed between the photoelectric conversion layer and the upper electrode.

10. An imaging element, comprising:
the photoelectric conversion apparatus according to claim 1;
a reading circuit connected to the photoelectric conversion apparatus; and
a signal processing circuit configured to perform signal processing in accordance with information transferred from the reading circuit.

11. The imaging apparatus according to claim 10, further comprising a reception unit configured to receive information externally supplied or a transmission unit configured to externally transmit information.

12. An imaging apparatus comprising:
the imaging element according to claim 8; and
a plurality of lenses,
wherein the imaging element receives light transmitted through the plurality of lenses.

13. An imaging element, comprising:
the photoelectric conversion apparatus according to claim 7;
a reading circuit connected to the photoelectric conversion apparatus; and
a signal processing circuit configured to perform signal processing in accordance with information transferred from the reading circuit.

14. An imaging apparatus comprising:
the imaging element according to claim 13; and
a plurality of lenses,
wherein the imaging element receives light transmitted through the plurality of lenses.

15. A photoelectric conversion apparatus comprising:
a substrate including a transistor;
an insulating layer disposed over the substrate, a plurality of recesses being formed by the insulating layer;
a photoelectric conversion unit disposed in at least one of the plurality of recesses and disposed over the substrate;
an upper electrode disposed over the photoelectric conversion unit,
wherein the upper electrode extends continuously across the recesses and includes a first portion and a second portion inclined relative to the first portion, and
wherein at least one of wires contacts the upper electrode at the second portion of the upper electrode.

16. The photoelectric conversion apparatus according to claim 15, wherein
the insulating layer includes at least two layers, and
the photoelectric conversion apparatus includes a wire connected to the upper electrode,
the wire includes a first wire and a second wire, and
at least one of the wires is disposed between the at least two layers; and
wherein a portion of the insulating layer is disposed between the first wire and the second wire so that the first wire, the portion of the insulating layer, and the second wire are arranged in this order on a line perpendicular to a surface of the substrate.

17. An imaging apparatus comprising:
a plurality of lenses;
an imaging element configured to receive light transmitted through the plurality of lenses, the imaging element including:
the photoelectric conversion apparatus according to claim 15;
a reading circuit connected to the photoelectric conversion apparatus; and
a signal processing circuit configured to perform signal processing in accordance with information transferred from the reading circuit.

18. A photoelectric conversion apparatus comprising:
a substrate including a transistor;
an insulating layer disposed over the substrate, a plurality of recesses being formed by the insulating layer;
a photoelectric conversion unit disposed in at least one of the plurality of recesses and disposed over the substrate;
an upper electrode disposed over the photoelectric conversion unit;
at least one of wires connected to the upper electrode,
wherein a side surface of the at least one of wires contacts with the upper electrode, and
wherein the side surface of the at least one of wires is other than a bottom surface facing the substrate and a top surface being a surface opposite the bottom surface.

19. The photoelectric conversion apparatus according to claim 18,
further comprising a protective layer disposed over the upper electrode,
wherein a portion of the protective layer is disposed in the recess.

20. An imaging apparatus comprising:
a plurality of lenses;
an imaging element configured to receive light transmitted through the plurality of lenses, the imaging element including:
the photoelectric conversion apparatus according to claim 18;
a reading circuit connected to the photoelectric conversion apparatus; and
a signal processing circuit configured to perform signal processing in accordance with information transferred from the reading circuit.

\* \* \* \* \*